(12) United States Patent
Kinugasa et al.

(10) Patent No.: US 6,251,741 B1
(45) Date of Patent: Jun. 26, 2001

(54) METHOD OF MANUFACTURING A SEMICONDUCTOR DEVICE

(75) Inventors: Akinori Kinugasa; Tomoharu Mametani; Yukihiro Nagai; Hiroaki Nishimura, all of Tokyo; Takeshi Kishida, Hyogo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/219,786

(22) Filed: Dec. 23, 1998

(30) Foreign Application Priority Data

May 20, 1998 (JP) .................................................. 10-137897

(51) Int. Cl.$^7$ ............................................. H01L 21/8242
(52) U.S. Cl. ..................... 438/396; 438/253; 257/309; 257/311; 257/532
(58) Field of Search .................................. 438/253–256, 438/396–399; 257/309, 311, 532

(56) References Cited

U.S. PATENT DOCUMENTS

| 5,084,405 | 1/1992 | Fazan et al. | 438/396 |
|---|---|---|---|
| 5,192,702 | 3/1993 | Tseng | 437/47 |
| 5,290,729 | 3/1994 | Hayashide et al. | 437/60 |
| 5,346,844 | * 9/1994 | Cho et al. | 438/396 |
| 5,550,076 | * 8/1996 | Chen | 438/396 |
| 5,726,086 | * 3/1998 | Wu | 438/253 |
| 5,863,821 | * 1/1999 | Chao | 438/253 |
| 5,972,769 | * 10/1999 | Tsu et al. | 438/396 |

FOREIGN PATENT DOCUMENTS

| 06021393 | 1/1994 | (JP) . |
|---|---|---|
| 06061443 | 3/1994 | (JP) . |
| 09232542 | 9/1997 | (JP) . |

* cited by examiner

Primary Examiner—Charles Bowers
Assistant Examiner—Erik Kielin
(74) Attorney, Agent, or Firm—McDermott, Will & Emery

(57) ABSTRACT

There is described the manufacture of a semiconductor device having a storage node or high-yield manufacture of a compact memory IC. The present invention provides a method of manufacturing a semiconductor device including a basic dielectric layer formation step for forming a basic dielectric layer from a first dielectric material, a stopper film formation step for forming on the basic dielectric layer an etch stopper film from a second dielectric material differing from the first dielectric film, a sacrificial dielectric layer formation step for forming on the etch stopper film a sacrificial dielectric layer from the first dielectric material, a space formation step for forming a storage node formation space by removal of a predetermined area from the sacrificial dielectric layer until the etch stopper film becomes exposed, a storage node formation step for forming in the storage node formation space a storage node from a capacitive material, and a sacrificial dielectric layer removal step for removing the sacrificial dielectric layer surrounding the storage node by means of an etching operation suitable for removal of the first dielectric material.

4 Claims, 4 Drawing Sheets

METHOD OF MANUFACTURING A SEMICONDUCTOR DEVICE

BACKGROUND OF THE INVENTION

1. Field of the Invention

The present invention generally related a method of manufacturing a semiconductor device, and more particularly, to a method of manufacturing a semiconductor device having a storage node.

2. Description of the Background Art

A capacitor including a storage node as a constituent element has been used for a memory IC, e.g., DRAM. The capacitor (hereinafter referred to as a "storage node capacitor") comprises a storage node and a cell plate, both of which are formed from base material such as polysilicon, and a dielectric film which is interposed between the storage node and the cell plate and keeps them isolated from each other. With such a configuration, electric charges can be charged by the storage node and the cell plate by applying a voltage between them.

It is effective to ensure a larger surface area of the storage node capacitor in its occupation area for rendering the storage node capacitor compact. A greater surface area of the storage node can be ensured by forming the storage node into, e.g., the shape of a cylinder. Thus, a structure including a storage node formed into a cylindrical shape has been known as a structure of a storage node capacitor.

FIG. 10 shows the structure of a known cylindrical storage node 10. The storage node 10 shown in FIG. 10 can be provided by executing a series of operations described below.

(1) Formation of a sacrificial oxide layer (not shown) on a silicon oxide film 12;

(2) Formation of a contact hole 14 which passes through the sacrificial oxide layer and the silicon oxide film 12;

(3) Formation of a storage node contact 16 within the contact hole 14;

(4) Formation of a space used for forming a storage node 10 by removing the sacrificial oxide layer in a cylindrical form;

(5) Formation of the storage node 10 into a cylindrical shape within the space; and (6) Formation of the storage node 10 into a state shown in FIG. 10 by etching away the sacrificial oxide layer surrounding the storage node.

It is effective to form the storage node 10 into an elongated shaped for providing a compact storage node capacitor having a large capacity and having the aforementioned conventional structure. However, the narrower the storage node 10, the more the node becomes apt to tilt. Particularly, in the foregoing existing method, an etching effect is sometimes exerted on the silicon oxide film 12 as well as on the sacrificial oxide layer.

If an etching effect is exerted on the silicon oxide film 12, the adhesion between the bottom surface of the storage node 10 and the silicon oxide film 12 is deteriorated, thus rendering the storage node more likely to tilt. For this reason, so long as the existing manufacturing method is used, it is difficult to make the storage node 10 compact while maintaining a high yield. More specifically, it is difficult to make a memory IC compact while maintaining a high yield.

SUMMARY OF THE INVENTION

The present invention has been conceived to solve the above-mentioned problem, and a general object of the present invention is to provide a novel and useful method of manufacturing a semiconductor device.

A more specific object of the present invention is to provide a method of manufacturing a semiconductor device which enables the manufacture of a compact memory IC at a high-yield by ensuring superior adhesion between a storage node and a dielectric film provided below the storage node.

The above object of the present invention is achieved by a method of manufacturing a semiconductor device. The method comprising the steps of forming a basic dielectric layer from a first dielectric material; forming on the basic dielectric layer an etch stopper film from a second dielectric material differing from the first dielectric film; forming on the etch stopper film a sacrificial dielectric layer from the first dielectric material; forming a space used for a formation of a storage node by removal of a predetermined area from the sacrificial dielectric layer until the etch stopper film becomes exposed; forming in the space a storage node from a capacitive material; and removing the sacrificial dielectric layer surrounding the storage node by means of an etching operation suitable for removal of the first dielectric material.

Other objects and further features of the present invention will be apparent from the following detailed description when read in conjunction with the accompanying drawings.

DESCRIPTION OF THE PREFERRED EMBODIMENTS

Figure 1:
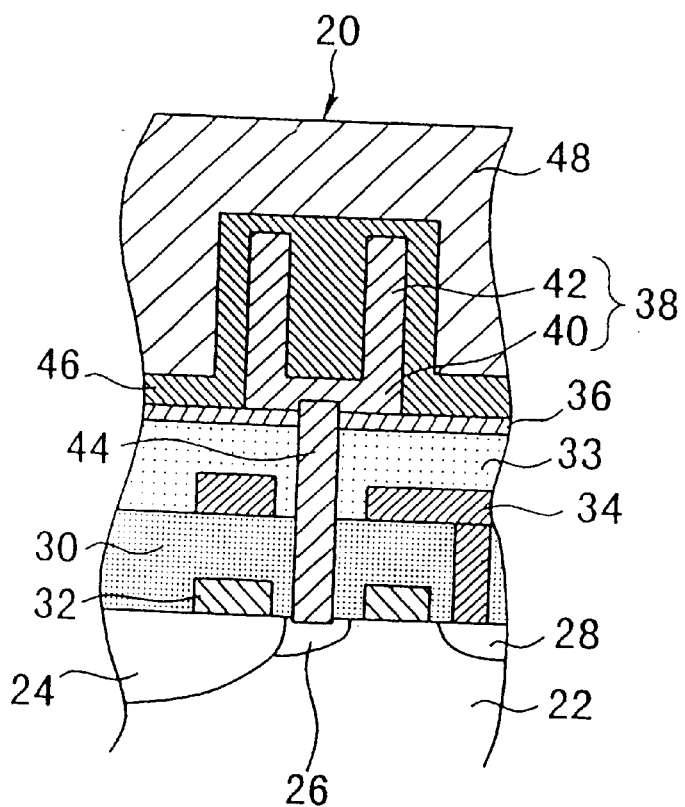
FIG. 1 is a cross-sectional view showing a memory cell of DRAM according to a first embodiment of the present invention.

In the following, principles and embodiments of the present invention will be described with reference to the accompanying drawings. Elements common among the drawings are assigned identical reference numerals, and repetitions of their descriptions are omitted.

First Embodiment

FIG. 1 shows a cross-sectional view of a memory cell of DRAM 20 according to a first embodiment of the present invention. The DRAM 20 comprises a plurality of memory cells which are identical to that shown in FIG. 1.

The DRAM 20 comprises a silicon substrate 22. A field separation region 24 and n-type regions 26 and 28 are provided in the silicon substrate 22. The field separation region 24 is a dielectric layer used for separating the silicon substrate 22 into memory cell regions. The n-type regions 26, 28 respectively constitute a drain electrode and a source electrode of the memory cell. A region between the drain and source electrodes constitutes a channel of the memory cell.

A first TEOS (Tetra Ethyl Ortho Silicate) layer 30 is provided on the silicon substrate 22. A plurality of transfer gates 32 are formed so as to extend in parallel in the vicinity of the bottom surface of the first TEOS layer 30. A second TEOS layer 33 is provided on the first TEOS layer 30. A plurality of bit lines 34 are provided so as to extend in parallel in the vicinity of the bottom surface of the second TEOS layer 33. The bit line 34 is in conduction with the n-type region 28.

A nitride film 36 is formed on the second TEOS layer 33. The nitride film 36 constitutes the principal element of the DRAM 20 according to the first embodiment. A storage node 38 is provided on the nitride film 36. The storage node 38 comprises a bottom surface 40 extending along the surface of the nitride film 36 and a cylindrical portion 42 surrounding the bottom surface 40. A storage node contact 44 is formed in the bottom surface 40 so as to penetrate through the first TEOS layer 30, the second TEOS layer 33, and the nitride film 36. The storage node contact 44 is in conduction with the n-type region 26.

The storage node 38 and the nitride film 36 are covered with a cell plate 48. An inter-layer dielectric film 48 is provided on the cell plate 46. The storage node 38 and the cell plate 46 constitute a capacitor for charging electric charge when a voltage is applied to the storage node contact 44.

A method of manufacturing the DRAM 20 according to the first embodiment will now be described with reference to FIGS. 2 through 8.

Figure 2:
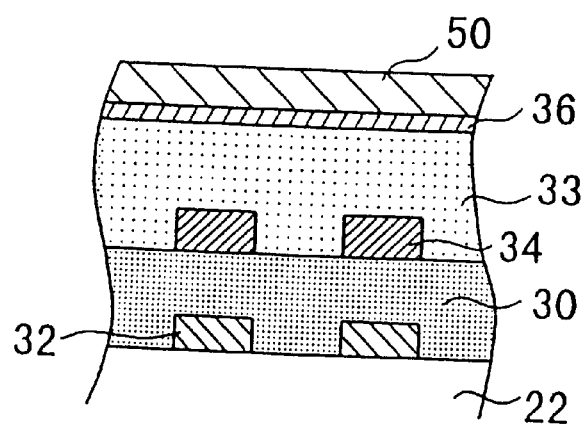
FIG. 2 is a cross-sectional view 1 for describing a method of manufacturing the DRAM according to the first embodiment.

FIG. 2 is a cross-sectional view for describing steps performed for providing a first sacrificial oxide layer 50 on the nitride film 36. During the process of manufacturing the DRAM 20, the first sacrificial oxide layer 50 is provided on the nitride film 36 through execution of processing operations of the fist through sixth steps, which will be described below.

In the first step, a transfer gate 32 is formed on the surface of the silicon substrate 22.

In the second step, TEOS is deposited on the transfer gate 32 in order to provide the first TEOS layer 30.

In the third step, the bit lines 34 are formed on the first TEOS layer 30.

In the fourth step, TEOS is deposited on the bit lines 34 in order to provide the second TEOS layer 33.

In the fifth step, a silicon nitride film SiN is deposited on the second TEOS layer 33. As a result, the nitride film 36 is provided on the second TEOS layer 33.

In the sixth step, the first sacrificial oxide layer 50 is provided by depositing TEOS on the nitride film 36.

After completion of the foregoing processing operations, a processing operation is carried out to form the storage node contact 44.

Figure 3:
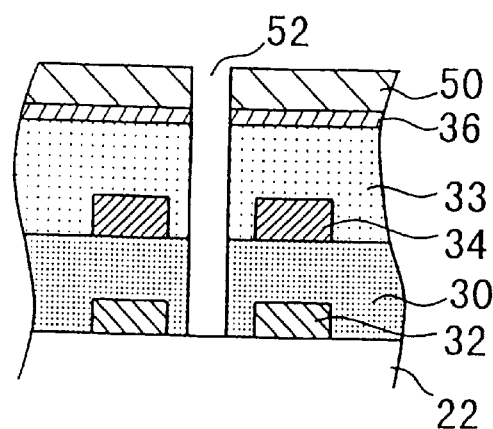
FIGS. 3 through 8 are views 2 through 7 similar to FIG. 2.
Figure 4:
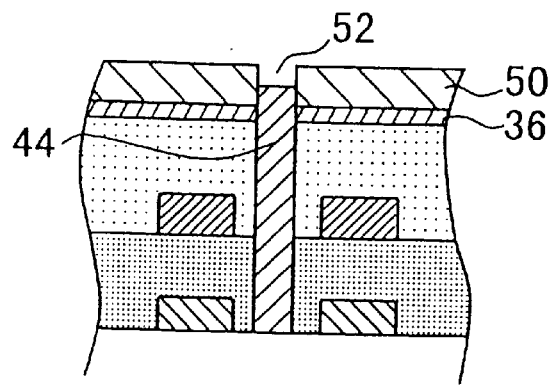

FIGS. 3 and 4 are views for describing the process performed for providing the storage node contact 44. During the process of providing the storage node contact 44, there are performed the processing operations in the seventh through eleventh steps, which will be described below.

In the seventh step, a given area of the first sacrificial oxide layer 50 is removed by means of photolithography and oxide film etching.

In the eighth step, a given area of the nitride film 36 is removed by means of photolithography and nitride film etching.

In the ninth step, given portions of the first and second TEOS layers 30 and 33 are removed by means of photolithography and oxide film etching.

As shown in FIG. 3, as a result of execution of the processing operations of the seventh through ninth steps, a contact hole 52 is formed so as to penetrate through the first and second TEOS layers 30 and 33, the nitride film 36, and the first sacrificial oxide layer 50.

In the tenth step, doped polysilicon is deposited inside the contact hole 52. In this step, the doped polysilicon is deposited until it protrudes through the level of the nitride film 36; namely, until it reaches the inside of the first sacrificial oxide layer 50.

In the eleventh step, as shown in FIG. 4, the storage node contact 44 is provided by etching away the thus-deposited doped polysilicon to a suitable extent.

After completion of the aforementioned processing operations, a second sacrificial oxide layer 54 is provided.

Figure 5:
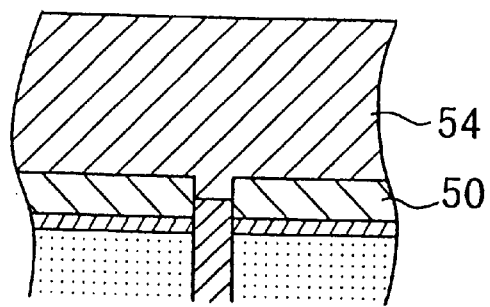

FIG. 5 is a cross-sectional view for describing the process of providing the second sacrificial oxide layer 54. During the process of manufacturing the second sacrificial layer 54, a processing operation of the twelfth step, which will be described below, is performed.

In the twelfth step, the second sacrificial oxide layer 54 is provided by depositing TEOS on the first sacrificial oxide layer 50.

After completion of the foregoing processing operation, there is performed an operation for providing a space used for forming a storage node. Hereinafter, the operation is referred to as a "space forming operation")

Figure 6:
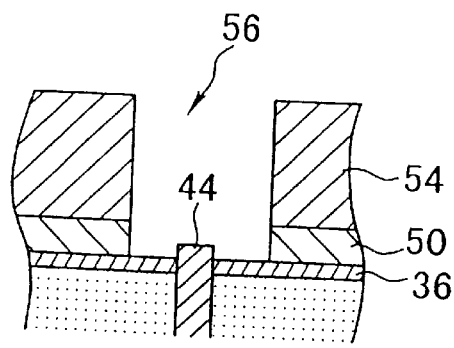

FIG. 6 is a cross-sectional view for describing the space forming operation. During the space forming operation, a processing operation described below is performed in the thirteenth step.

In the thirteenth step, given areas of the first and second sacrificial oxide layer 50 and 54 are removed by means of photolithography and oxide film etching. As shown in FIG. 6, the oxide layers 50 and 54 are etched away until the surface of the nitride film 36 becomes exposed and the upper end of the storage node contact 44 also becomes exposed. As a result of execution of the processing operation of the thirteenth step, a space 56 used for forming a storage node is provided.

As mentioned above, the oxide film etching is performed during the forming process of the space 56. In this case, the nitride film 36 effectively acts as an etch stopper. Therefore, the foregoing method enables stable formation of a desired space 56 at all times without being affected by variations of etching conditions during the space formation process.

After completion of the foregoing processing operation, a process of forming a storage node is carried out.

Figure 7:
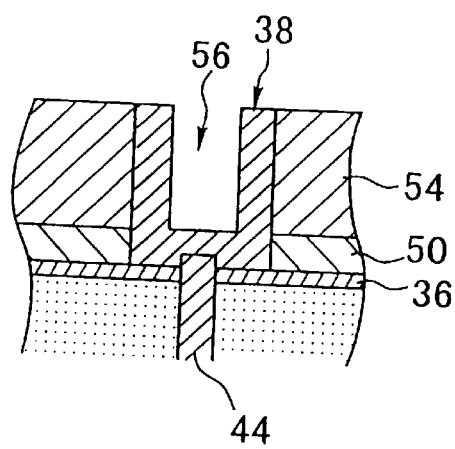

FIG. 7 is a cross-sectional view for describing the process of forming a storage node. During the storage node forming process, processing operations of the fourteenth and fifteenth steps, which will be described later, are carried out.

In the fourteenth step, amorphous silicon is deposited inside the space 56.

In the fifteenth step, a given area of the amorphous silicon deposited within the space 56 is removed by means of photolithography and silicon etching. As a result, the storage node 38 is provided as shown in FIG. 7.

As mentioned previously, in the present embodiment, the storage node contact 44 is formed so as to protrude through the level of the nitride film 36. With such a construction, the amorphous silicon deposited within the space 56 and the storage node contact 44 can be brought into superior conduction with each other. Accordingly, the semiconductor device manufacturing method according to the first embodiment enables a superior conductive state between the storage node 38 and the storage node contact 44.

Figure 8:
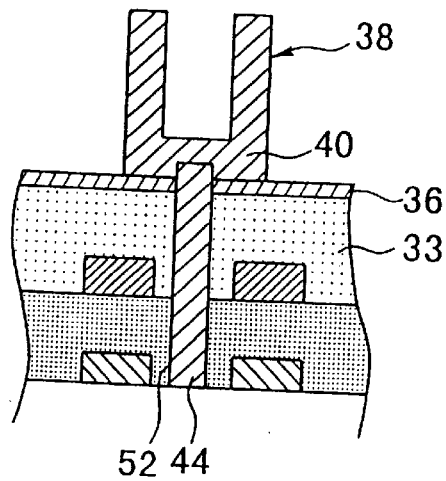

After completion of the foregoing processing operation, a process of removing a sacrificial oxide layer is carried out. FIG. 8 is a cross-sectional view for describing the sacrificial oxide layer removal process. During the sacrificial oxide layer removal process, a processing operation described below is carried out in the sixteenth step.

In the sixteenth step, the first and second sacrificial oxide layers 50 and 54 still remaining around the storage node 38 are removed by oxide film etching. In the present embodiment, the entire second TEOS layer 33, exclusive of the contact hole 52, is coated with the nitride film 36. In this case, the effect of oxide film etching is reliably blocked by the presence of the nitride film 36, thus not being exerted on the second TEOS layer 33.

The processing performed in the sixteenth step enables removal of undesired sacrificial oxide layers 50 and 54 without eroding the dielectric layer beneath the storage node 38. For this reason, the semiconductor device manufacturing method according to the present embodiment effectively prevents the storage node 38 from tilting without regard to variations in etching conditions. Accordingly, the method according to the present embodiment enables to manufacture an elongated storage node 38, namely, enable to miniaturize the DRAM while maintaining a high yield.

Although the storage node 38 is formed into a cylindrical shape in the foregoing embodiment, the present invention is not limited to such a cylindrical storage node. For example, the storage node 38 may be formed into a fin shape. Alternatively, the storage node 38 may be formed from a thick film or formed so as to have a rough surface.

In the previous embodiment, the upper end of the storage node contact 44 is formed so as to protrude through the level of the nitride film 36 in order to bring the storage node 38 and the storage node contact 44 into superior conduction with each other. To realize such a structure, the storage node contact is formed after the first sacrificial oxide layer 50 has been formed on the nitride film 36. However, the present invention is not limited to such a structure. If the storage node contact 44 can be brought into sufficient conduction with the storage node 38 without use of the foregoing structure, the formation of the first sacrificial oxide layer 50 may be omitted.

Second Embodiment

A second embodiment of the present invention will now be described by reference to FIG. 9.

Figure 9:
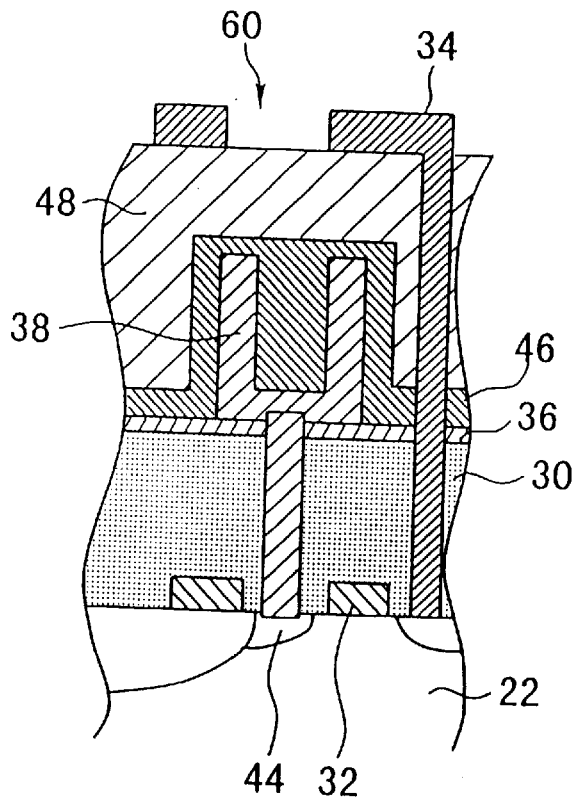
FIG. 9 is a cross-sectional view showing a memory cell of DRAM according to a second embodiment of the present invention.
Figure 10:
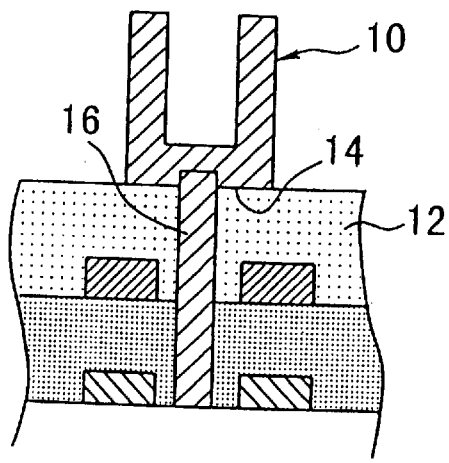
FIG. 10 is a cross-sectional view for describing an existing method of manufacturing a storage node.

FIG. 9 shows a cross-sectional view of a memory cell of second DRAM 60 according to the second embodiment. The DRAM 60 according to the second embodiment has a plurality of memory cells similar to that shown in FIG. 9.

The DRAM 20 shown in FIG. 1 comprises the first TEOS layer 30 having the bit lines 34, the second TEOS layer 33 provided thereon and the nitride film 36 provided on the second TEOS layer 33. The DRAM 60 according to the second embodiment differs from the DRAM 20 in that the nitride film 36 is provided on the first TEOS layer 30 and in that the bit lines 34 is provided on the interlayer dielectric film 46.

During the process of manufacturing the DRAM 60 according to the second embodiment, the storage node 38 is manufactured under the same method as that used in the first embodiment. The nitride film 36, therefore, acts as an etch stopper when the sacrificial oxide layer surrounding the storage node 38 is etched away during the process of manufacturing the DRAM 60. The semiconductor device manufacturing method according to the second embodiment effectively prevents the storage node 38 from tilting or enables to miniaturize the DRAM 60 while maintaining a high yield, as in the case of the first embodiment.

The present invention having the previously-described structure yields the following advantageous results:

According to the first aspect of the present invention, a dielectric film beneath a storage node is reliably prevented from being eroded at the time of removal of a sacrificial dielectric layer surrounding the storage node. Accordingly, the present invention enables to manufacture a compact semiconductor device at a high-yield by effectively preventing a storage node from tilting.

According to the second aspect of the present invention, a cylindrical storage node is effectively prevented from tilting. Accordingly, the present invention enables to manufacture a compact semiconductor device at a high-yield.

According to the third aspect of the present invention, an etch stopper film exists over the entire surface among a plurality of storage nodes and beneath the plurality of storage nodes. Accordingly, the present invention enables to effectively prevent the stability of a storage node from being deteriorated after a removal of a sacrificial oxide layer.

According to the fourth aspect of the present invention, a storage node contact protrudes through a level of an etch stopper film. Accordingly, the present invention enables a stable conductive state between a storage node and a storage node contact.

Further, the present invention is not limited to these embodiments, but variations and modifications may be made without departing from the scope of the present invention.

What is claimed is:

1. A method of manufacturing a semiconductor device comprising the steps of:

forming a basic dielectric layer from a first dielectric material;

forming on the basic dielectric layer an etch stopper film, having an upper surface, from a second dielectric material differing from the first dielectric film;

forming on the upper surface of the etch stopper film a first sacrificial dielectric layer from the first dielectric material;

forming a contact hole which penetrates through the first sacrificial dielectric layer and the etch stopper film;

forming in the contact hole a storage node contact which passes through the etch stopper film until it reaches the inside of the first sacrificial dielectric layer;

forming a second sacrificial dielectric layer from the first dielectric material so as to cover the etch stopper film and the storage node contact;

forming a space used for a formation of a storage node by removal of a predetermined area from the first and second sacrificial dielectric layers to expose a portion of the upper surface of the etch stopper film and the portion of storage node contact which protrudes through the etch stop film;

forming in the space a storage node from a capacitive material, the storage node having a lower surface substantially parallel to and in contact with the exposed portion of the upper surface of the etch stopper film, and removing the first and second sacrificial dielectric layers surrounding the storage node by means of an etching operation suitable for removal of the first dielectric material.

2. The method of manufacturing a semiconductor device according to claim 1, wherein the first dielectric material is semiconductor oxide, and the second dielectric material is semiconductor nitride.

3. The method of manufacturing a semiconductor device according to claim 1, wherein the storage node is formed into a cylindrical shape.

4. The method of manufacturing a semiconductor device according to claim 1, wherein a plurality of storage nodes are formed on the semiconductor substrate, and the etch stopper film exists over the entire surface between the plurality of storage nodes and beneath the storage nodes.

* * * * *